Figure 1:
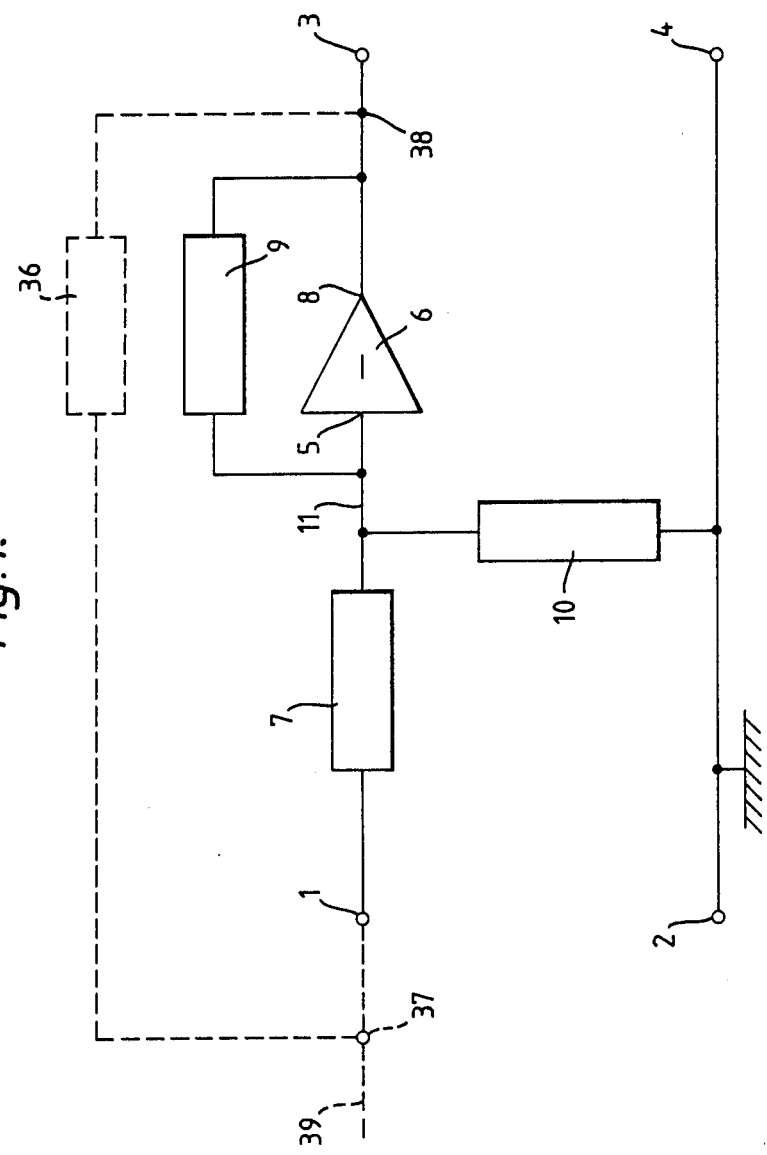

United States Patent [19]

Moore et al.

[11] Patent Number: 4,779,056
[45] Date of Patent: Oct. 18, 1988

[54] ACTIVE FILTER

[75] Inventors: Paul A. Moore, Hove; Colin L. Perry, Crawley, both of England

[73] Assignee: U.S. Philips Corporation, New York, N.Y.

[21] Appl. No.: 128,666

[22] Filed: Dec. 4, 1987

[30] Foreign Application Priority Data

Dec. 5, 1986 [GB] United Kingdom ............... 8629110

[51] Int. Cl.$^4$ .............................................. H03F 1/34
[52] U.S. Cl. ..................................... 330/107; 328/167; 330/294; 330/302
[58] Field of Search ............... 330/107, 109, 294, 302, 330/306; 327/520; 328/167; 333/172

[56] References Cited

FOREIGN PATENT DOCUMENTS 1473106 5/1977 United Kingdom .

OTHER PUBLICATIONS

Jacobs et al., "Design Techniques for MOS Switched Capacitor Ladder Filters", IEEE Transactions on Circuits and Systems, vol. CAS-25, No. 12, Dec. 1978, pp. 1014–1021.

Primary Examiner—James B. Mullins
Attorney, Agent, or Firm—Bernard Franzblau

[57] ABSTRACT

A filter comprises an amplifier circuit arrangement having a signal input (1) and a signal output (8) and a coupling (36) between a point (37) on a signal path (39) to the signal input and a point (38) on a signal path from the signal output. The amplifier circuit arrangement comprises an inverting amplifier (6) to the input (5) of which the signal input (1) is connected via a series impedance (7), e.g. a resistor. A feedback impedance (9), e.g. a capacitor, connects the amplifier output (8) to its input so that this input constitutes a virtual ground. The phase relationship between the input and output signals of such an arrangement changes from inverting to non-inverting at frequencies at which the gain of the amplifier drops to below unity because of forward feed through the feedback impedance (9), thereby upsetting the phase relationship between the signals passing through the arrangement and those passing through the coupling. Accordingly, a further impedance (10), e.g. a capacitance, is provided between the common point (11) of the series and feedback impedances and ground. At frequencies at which the amplifier gain is high, this further impedance has virtually no effect because of the virtual ground existing at the common point (11). However, at frequencies at which the amplifier gain drops to unity or below, the virtual ground effect is lost and the further impedance forms a potential divider with the series impedance (7), reducing the proportion of the input signal which can take the direct forward path through the feedback impedance.

8 Claims, 2 Drawing Sheets

ACTIVE FILTER

DESCRIPTION

This invention relates to a filter comprising an amplifier circuit arrangement having a signal input and a signal output, and a coupling between a point on a signal path to said signal input and a point on a signal path from said signal output, said amplifier circuit arrangement comprising a high-gain inverting amplifier the output of which constitutes said signal output, a series impedance interconnecting said signal input and the input of said amplifier, and a feedback impedance coupling the amplifier output to the common point of the series impedance and the amplifier input so that said common point constitutes a virtual earth.

Active ladder filters of this kind are described, for example, in an article by G. M. Jacobs, D. J. Allstot, R. W. Brodersen and P. R. Gray entitled "Design Techniques for MOS Switched Capacitor Ladder Filters" in IEEE Transactions on Circuits and Systems, Vol. CAS-25, No. 12, December 1978, pages 1014–1021, for example FIG. 9 on page 1019. This FIG. 9 shows a switched-capacitor third-order elliptic low-pass filter comprising three operational amplifiers each of which is provided with a feedback capacitor from its output to its inverting input. In series with a signal input to each inverting input is provided a respective impedance in the form of a switch which connects a capacitor to an input signal path and to the inverting input alternately under the control of a clock signal generator. Each resulting combination of an amplifier and its associated series impedance and feedback capacitor thus constitutes an integrator circuit, these being suitably intercoupled to form the filter. It has been found that practical constructions of such filters tend to have poor stop-band responses, at least at relatively high frequencies, and it is an object of the present invention to effect an improvement in this respect.

The invention provides a filter comprising an amplifier circuit arrangement having a signal input and a signal output, and a coupling between a point on a signal path to said signal input and a point on a signal path from said signal output, said amplifier circuit arrangement comprising a high-gain inverting amplifier the output of which constitutes said signal output, a series impedance interconnecting said signal input and the input of said amplifier, and a feedback impedance coupling the amplifier output to the common point of the series impedance and the amplifier input so that said common point constitutes a virtual earth, characterised in that a further impedance is connected between said common point and a reference potential point to reduce the overall gain of the amplifier circuit arrangement from the signal input to the amplifier output at a frequency at which the gain of the inverting amplifier has fallen to unity.

It has now been recognised that the aforesaid poor stop-band response of the known filters arises because, as is always the case, the gain of each operational amplifier falls off at high frequencies, reaching unity at a given frequency and being less than unity at frequencies higher than this. At frequencies at which the gain is less than unity the signal path available from the amplifier inverting input to its output through the feedback impedance predominates over that through the amplifier. The result is that as the amplifier gain drops through unity there is an abrupt change in the phase relationship between a signal applied to its inverting input and the corresponding signal at its output. As correct operation of the known filter circuits depends on the maintenance of specific phase relationships between signals traversing the signal path through each combination of an amplifier, input series impedance and feedback impedance, and signals traversing paths around each such combination it will be evident that, at frequencies at and above those at which the amplifier gains drop to unity, the filter performance will cease to correspond with that required. In particular, it will be likely that the high-frequency stop-band performance of a low-pass or band-pass filter will be substantially degraded. A high-gain inverting amplifier provided with a feedback impedance and an impedance in series with its input forms, as is known, a so-called "virtual earth" amplifier if the ratio of the open-loop gain to the closed loop gain is large; the signal level on the common point of the series impedance and the feedback impedance is small compared with the input signal, i.e. the common point is effectively at ground potential as far as signal voltages are concerned. Thus, a further impedance can be connected between the common point and a reference potential point without substantially affecting the overall amplifier performance at frequencies at which the amplifier gain is high. However, at relatively high frequencies for which the amplifier gain is low, in particular at or below unity, the virtual earth property is lost and a considerable proportion of the input signal appears on the common point. At such frequencies such a further impedance will form a potential divider with the input series impedance, thereby reducing the proportion of the input signal which can be fed to the amplifier output via the feedback impedance to degrade the high-frequency stop-band performance of a low-pass or band-pass filter in which the amplifier arrangement may be incorporated.

In order to minimise any effect that the further impedance might have on the low-frequency performance of the amplifier arrangement while obtaining a large potential-divider effect at high frequencies the further impedance is preferably such that its impedance value is relatively high at low frequencies and relatively low at high frequencies. Thus, preferably, the further impedance comprises a capacitor. In any case, in order to provide a large potential divider effect, the value of the further impedance is preferably low compared with the value of the series impedance, at least at the frequency at which the gain of the inverting amplifier has dropped to unity.

Figure 2:
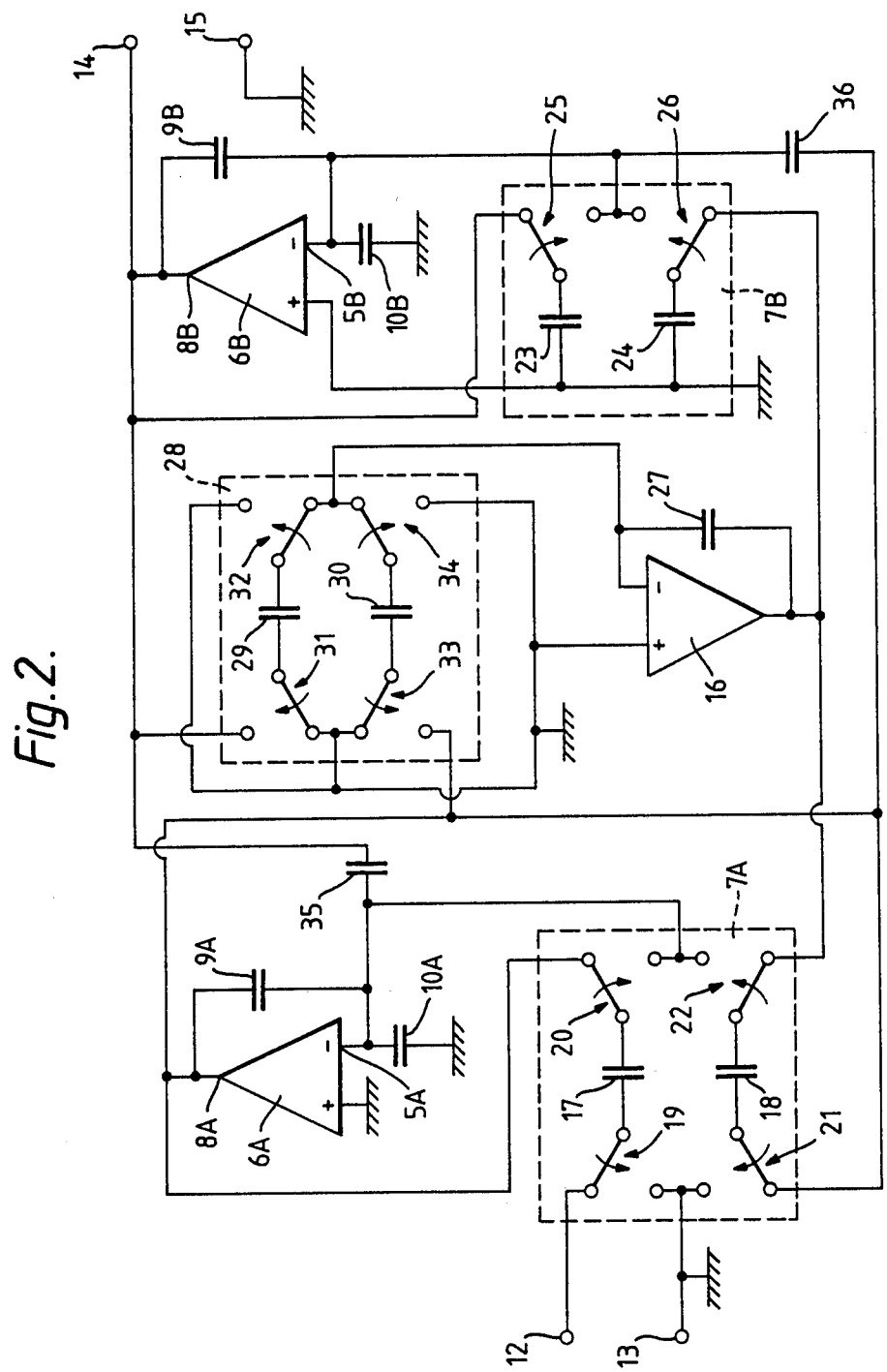

Embodiments of the invention will now be described, by way of example, with reference to the accompanying diagrammatic drawings in which FIG. 1 is a circuit diagram of a first embodiment in generalized form, and FIG. 2 is a more detailed circuit diagram of a second embodiment.

In FIG. 1 a filter includes an amplifier circuit arrangement having a pair of input terminals 1,2 and a pair of output terminals 3,4, terminals 2 and 4 being directly interconnected and connected to ground. Input terminal 1 is connected to the input 5 of a high gain inverting amplifier 6 (which may be an operational amplifier the non-inverting input of which is connected to ground) via a series impedance 7. The output 8 of amplifier 6 is connected to its input 5 via a feedback impedance 9 so that the input 5 constitutes a virtual earth, and also to the output terminal 3. The arrangement so far described constitutes a conventional virtual-earth amplifier. If the values of the impedances 7 and 9 are Z7 and Z9 respectively the gain Vout/Vin from input terminals 1,2 to output terminals 3,4 at frequencies for which the gain of amplifier 6 is high is given by Vout/Vin=-Z9/Z7. However at frequencies higher than that at which the amplifier gain drops to unity the gain tends towards +1 (assuming open-circuited output terminals 3,4) which, as pointed out before, can be a disadvantage if, for example, the arrangement forms part of a band-pass or low-pass filter. Thus when a further coupling 36 (shown in dashed lines) having a suitable transfer characteristic is provided between a point 37 on a signal input path 39 to the input terminal 1 and a point 38 on the signal output path from the amplifier 6 to form the complete filter, the required phase relationship will no longer be maintained between any signals from the two paths which are summed at the point 37 and/or the point 38, when the signal frequency is such that the gain of amplifier 6 is at or below unity. In order to mitigate this disadvantage a further impedance 10 is provided between the common point 11 of impedances 7 and 9 and a reference potential point, in the present case ground. This has substantially no effect on the operation of the circuit at those frequencies for which the gain of the amplifier 6 is high, because point 11 constitutes a virtual earth. However, if the impedance value of impedance 10 is Z10, at frequencies at and higher than that at which the amplifier gain drops to unity the potential divider formed by impedances 7 and 10 now causes the gain from input 1,2 to output 3,4 to approach Z10/(Z10+Z7) which, if Z10 is chosen small with respect to Z7, can be made to approach zero. Thus direct feedthrough at those frequencies to output terminal 3 via impedance 9 can be substantially prevented.

The impedances 7,9 and 10 can be constituted by resistors, capacitors or inductors, or two-terminal networks made up from resistors and/or capacitors and/or inductors. Impedance 10 preferably, however, comprises a capacitor in order to minimise its effect on the operation of the circuit at relatively low frequencies for which the gain of amplifier 6 is high (when its impedance value will be relatively high) and maximise its effect on the operation of the circuit at relatively high frequencies for which the amplifier gain is low (when its impedance value will be relatively low). Impedance 7 may, for example, be constituted by the internal resistance of a transconductance amplifier (not shown) having its output connected to terminals 1,2. As another example impedance 7 may be constituted by a switch (not shown) arranged to repeatedly switch one electrode of a capacitor (not shown) between input terminal 1 and common point 11 alternately under the control of a clock signal generator (not shown), the other electrode of the capacitor being connected to ground or another reference potential point.

FIG. 2 is a circuit diagram of an active-ladder switched-capacitor third-order elliptic low-pass filter similar to that shown in FIG. 9 of the aforesaid article by Jacobs, Allstot, Brodersen and Gray. The filter has input terminals 12,13 and output terminals 14,15 and includes two circuit configurations which conform to the part of FIG. 1 of the accompanying drawings which is shown in full lines, these configurations comprising th components referenced 6A,7A,9A,10A and 6B,7B,9B,10B respectively. The signal path through each of these configurations, it will be noted, has a further coupling connected across it (c.f. coupling 36 in FIG. 1). The series impedance 7A, which is effectively a series resistance having inputs from the input terminals 12,13, the output 8A of inverting amplifier 6A and the output of a further inverting amplifier 16, is constituted by a switched capacitor circuit comprising a pair of capacitors 17,18 and four changeover switches 19,20,21,22 which are controlled by the output of a clock signal generator (not shown) to repeatedly change over with the relative phases indicated. When the switches are in the positions shown capacitors 17 and 18 are charged to voltages determined by an input voltage applied across terminals 12 and 13 and the output voltages of amplifiers 6A and 16. When the switches are in their other positions the capacitors are connected in parallel and the resulting voltage thereacross is applied to the input 5A of amplifier 6A. Similarly, the series impedance 7B, which is effectively a series resistance having inputs from the outputs of inverting amplifiers 6B and 16, is constituted by a switched capacitor circuit comprising a pair of capacitors 23,24 and two changeover switches 25,26 which are also controlled by the output of the clock signal generator to repeatedly change over with the relative phases indicated. When the switches are in the positions shown capacitors 23 and 24 are charged to voltages determined by the output voltages of amplifiers 6B and 16 respectively. When the switches are in their other positions the capacitors are connected in parallel and the resulting voltage thereacross is applied to the input 5B of amplifier 6B. Amplifier 16 is provided with a feedback capacitor 27 and its input is also provided with a series impedance 28 having inputs from the outputs 8A and 8B of amplifiers 6A and 6B. Series impedance 28, which is effectively a series resistance, is in the form of a switched capacitor circuit comprising capacitors 29,30 and four changeover switches 31,32,33 and 34 which are also controlled by the output of the clock signal generator to repeatedly change over with the relative phases shown (and with the phases shown relative to the switches 19–22, 25 and 26). Capacitors 35 and 36 couple the output 8B of amplifier 6B to input 5A of amplifier 6A and the output 8A of amplifier 6A to the input 5B of amplifier 6B respectively, to give the filter an elliptic characteristic. Output 14 is fed from the output 8B of amplifier 6B.

It will be noted that capacitors 10A and 10B are provided to ground from the inputs only of amplifiers 6A and 6B, i.e. those inputs to which the capacitors 35 and 36 are connected. These were found to be the most effective positions for such shunt capacitors although, of course, a further such capacitor could be connected from the inverting input of amplifier 16 to ground, if desired. The value of each shunt capacitor 10A and 10B is preferably such that, at the frequency at which the gain of the corresponding amplifier 6A or 6B drops to unity, its impedance is low compared with the effective series resistance of the corresponding switched-capacitor input circuit 7A or 7B. Values of 1nF were found to be appropriate in a particular case. Removal of these capacitors was found to result in a very considerable deterioration in the rejection properties of the filter at frequencies substantially equal to those at which the gains of the operational amplifiers 6A,6B and 16 drop to unity.

Of course the switched capacitor circuits 7A,7B and 28 may be replaced by physical series-resistors, if desired, together with additional circuitry to give the effect of, for example, the sign reversal which is effected in the circuit 28.

We claim:

1. A filter comprising an amplifier circuit arrangement having a signal input and a signal output, and a coupling between a point on a signal path to said signal input and a point on a signal path from said signal output, said amplifier circuit arrangement comprising a high-gain inverting amplifier the output of which constitutes said signal output, a series impedance interconnecting said signal input and the input of said amplifier, and a feedback impedance coupling the amplifier output to a common point of the series impedance and the amplifier input so that said common point constitutes a virtual ground a further impedance connected between said common point and a reference potential point to reduce the overall gain of the amplifier circuit arrangement from the signal input to the amplifier output at a frequency at which the gain of the inverting amplifier has fallen to unity.

2. An arrangement as claimed in claim 1, wherein the further impedance comprises a capacitance.

3. An arrangement as claimed in claim 2, wherein the series impedance effectively comprises a resistance.

4. An arrangement as claimed in claim 3, wherein the feedback impedance comprises a capacitance.

5. An arrangement as claimed in claim 2, wherein the value of said further impedance is low compared with the value of said series impedance at least at the frequency at which the gain of the inverting amplifier has fallen to unity.

6. An arrangement as claimed in claim 1, wherein the value of said further impedance is low compared with the value of said series impedance at least at the frequency at which the gain of the inverting amplifier has fallen to unity.

7. An arrangement as claimed in claim 1, wherein the series impedance effectively comprises a resistance.

8. An arrangement as claimed in claim 1, wherein the feedback impedance comprises a capacitance.

* * * * *